United States Patent [19]

Lapeyre

[11] Patent Number: 4,860,234

[45] Date of Patent: Aug. 22, 1989

[54] PORTABLE KEYBOARD OPERATED ALPHA COMPUTER SYSTEM WITH FEW KEYS AND VISUAL KEYSTROKE INSTRUCTIONS

[75] Inventor: James M. Lapeyre, New Orleans, La.

[73] Assignee: The Laitram Corporation, New Orleans, La.

[21] Appl. No.: 158,653

[22] Filed: Feb. 22, 1988

Related U.S. Application Data

[63] Continuation-in-part of Ser. No. 729,559, May 2, 1985, and a continuation-in-part of Ser. No. 844,872, Mar. 27, 1986, which is a continuation-in-part of Ser. No. 449,998, Jan. 21, 1983, Pat. No. 4,547,860.

[51] Int. Cl.[4] ............................................. G06F 3/023
[52] U.S. Cl. ......................... 364/709.16; 364/709.15
[58] Field of Search ................... 364/709.16, 709.15; 341/22

[56] References Cited

U.S. PATENT DOCUMENTS

| 3,675,513 | 7/1972 | Flanagan et al. | 364/709.16 |
| 3,967,273 | 6/1976 | Knowlton | 341/22 |
| 4,718,029 | 1/1988 | Morino et al. | 364/709.16 |

OTHER PUBLICATIONS

Claver et al, "Computer-Assisted Word Entry Process", *IBM Tech. Disclosure Bulletin*, vol. 21, No. 10, Mar. 1979, p. 4184.

*Primary Examiner*—David H. Malzahn
*Attorney, Agent, or Firm*—Laurence R. Brown; Alfred J. Mangels

[57] ABSTRACT

Alphameric electronic computers are made with fewer keys in keyboard assemblies for selection of a large range of input characters and instructions. To achieve this the computer and keyboard operates in two modes with one providing for example decimal digit processing from single keystroke entries and the other providing for example alphabetic character processing from two successive keystroke entries. The keys, strokes and instructions are cooperatively integrated by means of a visual display integrally located on the computer with coded indicia representing the entries and identifying the key or keys to be stroked and in the case of successive keystrokes representing the sequence of stroking. Accordingly reference to external manuals for computer operating or data entry instructions is rarely necessary.

12 Claims, 4 Drawing Sheets

FIG. 1

| 05 T / A RUN | 1 SVAS / 2 GTAS / 3 PRFL / 8 PRMT / 9 RNAM / 4 a / 7 VRFY / 6 c / 5 b | 1 INA / 2 OUTA / 3 ARCR / 8 ACA / 9 FMT / 4 d / 7 PRBF / 6 GTRO / 5 e | 1 INSC / 2 APPC / 3 APRC / 8 ARCL / 9 AVEW / 4 CASE / 7 ASTO / 6 INRC / 5 WDTH |
|---|---|---|---|
| − CHS / 7 PRBUF | − ACA / 7 ACX | − RCLALM / 7 RCLSW | − HMS − / 7 DDAYS |
| + RND / 4 PRX | + FMT / 4 ATIME | + CLRALMS / 4 RCLAF | + HMS + / 4 DATE + |
| × PRA / 1 PRFLAGS | × STKPLOT / 1 REGPLOT | × CLALMX / 1 CLALMA | × CLKTD / 1 CLKT |
| ÷ PRP / ↑ PR Σ | ÷ SKPCHR / ↑ ACCOL | ÷ CORRECT / ↑ XYZALM | ÷ DMY / ↑ T+X |
| 8 PRPLOT / 9 PRPLOTP | 8 ADATE / 9 ADV | 8 STOPSW / 9 RUNSW | 8 DATE / 9 TIME |
| 5 PRSTK / 6 PRREGX | 5 ATIME24 / 6 BLDSPEC | 5 SETSW / 6 ALMNOW | 5 DOW / 6 CLOCK |
| 2 PRAXIS / 3 PRREG | 2 ACSPEC / 3 ACCHR | 2 SETAF / 3 ALMCAT | 2 HR / 3 HMS |
| 0 LIST / XQ | 0 SKPCOL / XQ | 0 SETIME / XQ | 0 MDY / XQ |
| 04 Z / + | + A / 7 B / 8 C / − J / × K / 5 L / 2 S / 4 T / 1 U | 8 D / 5 E / 3 F / 7 M / 6 N / 4 O / 2 V / 1 W / 9 X | 9 G / 5 H / 6 I / 8 P / 1 Q / 3 R / 4 Y / 0 Z / 2 − |
| − Σ − / 7 ΣREG | − GTO. / 7 10↑X | − REGMOVE / 7 COPY | − READR / 7 READRX |
| + Σ + / 4 MEAN | + GTO / 4 LBL | + DEL / 4 GTO-AON | + GETR / 4 WRTRX |
| × SDEV / 1 CL Σ | × GTO.. / 1 XEQ | × PCLPS / 1 CLKEYS | × EMDIR / 1 SAVER |
| ÷ FACT / ↑ R-P | ÷ BEEP / ↑ PSE | ÷ SEEKR / ↑ REGSWAP | ÷ DIR / ↑ EMDIRX |
| 8 MOD / 9 P-R | 8 LN / 9 E↑X-1 | 8 CLD / 9 CLRGX | 8 GETRX / 9 SAVEX |
| 5 ΣREG? / 6 SIGN | 5 LOG / 6 LN1+X | 5 LBL-AON / 6 % | 5 %CH / 6 OWNER'S |
| 2 DEC / 3 OCT | 2 E↑X / 3 RTN | 2 CLP / 3 CLRG | 2 SAVERX / 3 GETX |
| 0 ON / XQ | 0 TONE / XQ | 0 CAT / XQ | 0 WRTR / XQ |
| 03 Y / X / BST | 1 , / 2 ? / 3 ! / 8 # / 9 CLFL / 4 ' / 7 $ / 6 GETP / 5 SAVP | 1 < / 2 ) / 3 > / 8 ≠ / 9 ( / 4 = / 7 GTSB / 6 _ / 5 ) | 1 ED / 2 ) / 3 : / 8 ↓ / 9 FLGZ / 4 & / 7 Σ / 6 % / 5 @ |
| − X>0? / 7 X>Y? | − PROMPT / 7 END | − R-D / 7 X>=NN? | − D-R / 7 ASIN |
| + X=0? / 4 X≠0? | + ABS / 4 SIZE? | + X≠NN? / 4 X<NN? | + RCLPT / 4 SIN |
| × BST / 1 X<> | × VIEW / 1 π | × X<=NN? / 1 X=NN? | × SEEKPT / 1 SEEKPTA |
| ÷ X=Y? / ↑ X≠Y? | ÷ AVIEW / ↑ A↑ | ÷ X>NN? / ↑ DELCHR | ÷ RCLPTA / ↑ POSFL |
| 8 PACK / 9 OFF | 8 POSA / 9 DSE | 8 EMROOM / 9 RESZFL | 8 ACOS / 9 ATAN |
| 5 X<Y? / 6 X<>F | 5 PSIZE / 6 ISG | 5 ASROOM / 6 DELREC | 5 COS / 6 TAN |
| 2 X<0? / 3 X<=Y? | 2 SQRT / 3 AROT | 2 X↑2 / 3 1/X | 2 Y↑X / 3 X<>Y |
| 0 X<=0? / XQ | 0 SIZE / XQ | 0 LASTX / XQ | 0 F29 TOG / XQ |
| 02 X / ÷ / SST | 01 L / ▲ / SHIFT | SPACE | − / − / 7 XQ LOK / − / − / 4 CLST/ST / × / × / 1 NULL / ÷ / ÷ / ↑ ALPHA |
| − GETKEY / 7 CLK 12 | − FC? / 7 FS?C | − ST− / 7 ASTO | 8 XEQ-AON / 9 EEX |
| + SETDATE / 4 RAD | + ALENG / 4 ARCL | + ST+ / 4 SF | 5 CLA/IND / 6 CLX |
| × AON / 1 ANUM | × ATOX / 1 R↑ | × STX / 1 ENG | 2 USER / 3 PRGM |
| ÷ SST / ↑ ASN | ÷ OWNER'S / ↑ ENTER↑ | ÷ ST/ / ↑ CONST | XQ / STOP |
| 8 GETKEYX / 9 CLK24 | 8 FC?C / 9 XTOA | 8 CF / 9 RCLFLAG | |
| 5 GRAD / 6 CRFLAS | 5 ASHF / 6 FS? | 5 OWNER'S / 6 STOFLAG | |
| 2 DEG / 3 CRFLD | 2 INT / 3 FRC | 2 FIX / 3 SCI | |
| 0 AOFF / XQ | 0 RCL / XQ | 0 STO / XQ | 0 RUN / XQ |

FIG. 3

| 1 | 2 | 3 |
|---|---|---|
| A₁ B₃ C₆ | D₁ E₂ F₆ | G₄ H₂ I₃ |
| J₄ K₅ L₂ | M₄ N₃ O₅ | P₅ Q₁ R₆ |
| S₁ T₄ U₅ | V₆ 1₁ 2₂ | 3₃ 4₄ 5₅ |
| W₆ X₂ Y₃ | Z₅ 6₄ 7₃ | 8₂ 9₁ 0₆ |
| 4 | 5 | 6 |

FIG. 5

| 7 | 8 | 9 |
|---|---|---|
| A 7  B 3  C 9<br>J 2  K 8  L 6<br>S 1  T 4  U 5<br>· ∧  : 0 → X/Q | D 7  E 5  F 8<br>M 9  N 4  O 6<br>V 3  W 1  X 2<br>; ∧  ′  0 → X/Q | G 7  H 9  I 6<br>P 5  Q 8  R 3<br>Y 1  Z 2  ′ -4<br>? ∧  ÷  0 → X/Q |
| 1 | 2 | 3 |
| ∴ | 0 | X |

PORTABLE KEYBOARD OPERATED ALPHA COMPUTER SYSTEM WITH FEW KEYS AND VISUAL KEYSTROKE INSTRUCTIONS

This is a continuation-in-part of copending cases U.S.S.N 729,559 filed May 2, 1985 for "Programmable Computer with Alphanumeric Capabilities having Few Keyboard Keys", and U.S.S.N. 844,872 filed March 27, 1986 for "Keyboard Located Indicia for Instructing a Multi-mode Programmable Computer Having Alphanumeric Capabilities from a Few Keyboard keys", both being Continuations-in-part of U.S.S.N. 449,998 filed Jan. 21, 1983 for "Computer Keyboards with Few Keys Designating Hundreds of Functions", now U.S. Pat. No. 4,547,860, Oct. 15, 1985. These background applications are incorporated herein in entirety by reference.

TECHNICAL FIELD

This invention relates to portable hand held alphameric keyboard-computer systems and more particularly it relates to the operation of computers with fewer keys by means of an alphabetic character entry mode requiring two or more successive keystrokes per character from as few as six keys and wherein keystroke instructions for the selection of keys and the sequence of stroking for the alphabetic characters are visually displayed as indicia to preclude reference to operation manuals.

BACKGROUND ART

Art such as U.S. Pat. Nos. 3,892,958, C. Tung, July 11, 1975 and 3,967,273, H. Knowlton, June 29, 1976; and European Patent Application 11, 307, filed Nov. 19, 1979 all related to the multiple use of keyboard keys for reducing the number of keys required on a keyboard for processing data. This is particularly desirable for hand carried portable alphanumeric computer systems now feasible in the art, which are capable of processing many input characters and of internally processing many algebraic and data processing functions. Both numerics and alphabets are required in the present state of the art for communication, calculating and data processing operations of the type performed in portable hand held keyboard actuated computers.

The knowlton patent reduces the number of keys required in a telephone instrument for alphanumeric transmission capabilities to twelve by requiring two successive choices of tone signals for every entry digit such as numeral 2 or letter k. The Tung patent reduces in a computer-keyboard system the number of keys by providing three functions for designated keys with two sets of alternative functions chosen by respective orange or blue prefix keys. Thus, a calculator with thirty-two keys can be used for about three times that many functional computer entries including instructions and data. This latter concept is used, for example, in "Hewlett-Packard" Model HP-41 type programmable calculators with full alphanumeric capabilities. Similarly "Texas Instruments" TI-88 line of programmable calculators have alphabetic capabilities with two keyboard functions selectable, plus an alphabetic entry mode.

The general state of the art of calculator systems with complex many functional capacity is represented by U.S. Pat. No. 3,863,060 to F. Rode et al., Jan. 28, 1975.

The state of prior art portable hand held keyboard operated computers have still required excessive keys and have made alpha character entries awkward and time consuming. Also many prior art calculators have introduced alpha capabilities at the expense of utilizing 26 or more separate keys for the alphabet, sometimes using typewriter-like keyboards.

It is therefore an objective of this invention to provide improved alphanumeric entries with corresponding internal operational processing capabilities in hand held keyboard entry computer systems, and in particular to overcome deficiencies of the prior art. Other objects, features and advantages will be found throughout the following description, drawing and claims.

DISCLOSURE OF THE INVENTION

A portable hand held alphameric keyboard-computer system is provided having increased efficiency of the number of characters entered and the number of functions performable by a small number of keys, typically six to sixteen in a keyboard array. The keyboard provides for entry of a full set of alphabetic characters from a subcombination of the keys. The system is operable in different modes selected from the keyboard, namely, (a) a calculating keyboard mode (default mode) for primary entry of a first set of data and control functions in response to single keystrokes, (b) a control mode for entry of command functions in response to at least two keystrokes from predetermined keys, and (c) an alpha mode for entry of alphabetic characters in response to at least two sequential keystrokes from predetermined combinations of a subset of said keys.

In particular, significant advantage is obtained in a programmable calculator with alphanumeric capabilities, namely the facile entry of alphanumeric entries in the alpha mode. In this two stroke mode it is possible to enter the full 26 letter alphabet plus the decimal digits 0 to 9 with as few as six keys, although more keys might be desirable, since some decimal and control functions are usually required. It is preferable however, that the working minimum number of keys be 12, because the use of 12 keys permits the digits 0 through 9, the decimal point and a control function to be executed in a single stroke default mode. The entry of a single alphabetic character on the other hand requires two distinct keystrokes. The speed of entry need not be hampered however, since the keys may be laid out in an easily accessible array so that the area of search, (compared to a single key, single letter keyboard) for the first stroke of a desired alpha character can be reduced to about 1/9 of the single stroke keyboard and is, for example, contained in a very small area occupied by only three keys. In fact, searching over such a small area for the desired letter, (on one of three keys), touching that key and then touching a second key at a known position (as indicated visually on a viewing panel in proximity to the first key touched) is sometimes faster than searching for a letter among twenty six keys and then striking that key once. This can be especially valuable for persons who "hunt and peck".

Cooperatively associated with the keys in a visible location integral with the keyboard assembly is a set of abbreviated instruction indicia designating keystroke selection sequences available from the computer for processing a corresponding set of computer commands for data entry and data processing operations. In particular, the two sequential keys to be stroked for entry of each alpha character are identified by visual indicia signifying the stroking sequence and the keys to be selected.

The keyboard of the preferred embodiment provides for entry of a set of key actuated computer operations including a subset of a large number of calculator command functions for data processing, a subset of numeric characters processable by the computer and a full subset of alpha characters processable by the computer. The latter is achieved by way of an alpha mode of operation responsive to sequential stroking of two keys in a mutually exclusive time sequence for each key command to enter alphabetic characters as digital signals. The computer has processing systems for entering, controlling and processing such digital signals in direct response to keystroke sequences.

In general, significant and unexpected advantage is achieved in reducing the number of keyboard keys required for processing alpha characters in hand held portable computer-keyboard systems, contrary to the trend in the art to expand the number of keys to produce more input selections necessitated by alphabetic characters or additional functional commands.

The visual display instructions eliminate the need for reference to operation manuals for entry of alpha characters and selection of many functions from the keyboard in a two stroke sequence, since both the first keystroke selections and the second keystroke selections are identified thereby. This is a particularly important feature in portable manual keyboard entry computer systems with limited space and wherein more closely packed keys do not give adequate room for manual actuation by the fingers.

BRIEF DESCRIPTION OF THE DRAWINGS

In the accompanying drawings:

FIG. 1 is a plan view of one preferred embodiment of a computer keyboard panel embodying the invention, wherein all twenty-six alphabet characters are present on only three of the sixteen keys.

FIG. 3 is a six-key keyboard array capable of entering all twenty-six letters of the alphabet and the decimal digits 0 through 9 when operable in a two-stroke per entry mode.

FIG. 4 is an alternate alpha keyboard layout on a computer having a computer processed temporary display panel for indicating the functions and modes being currently processed by the computer.

FIG. 5 is a layout of a twelve key keyboard array for an alphameric computer embodiment adapted for single stroke entry of decimal digits and a two-stroke per entry mode for entry of alphabetic characters.

THE PREFERRED EMBODIMENTS

Figure 4:
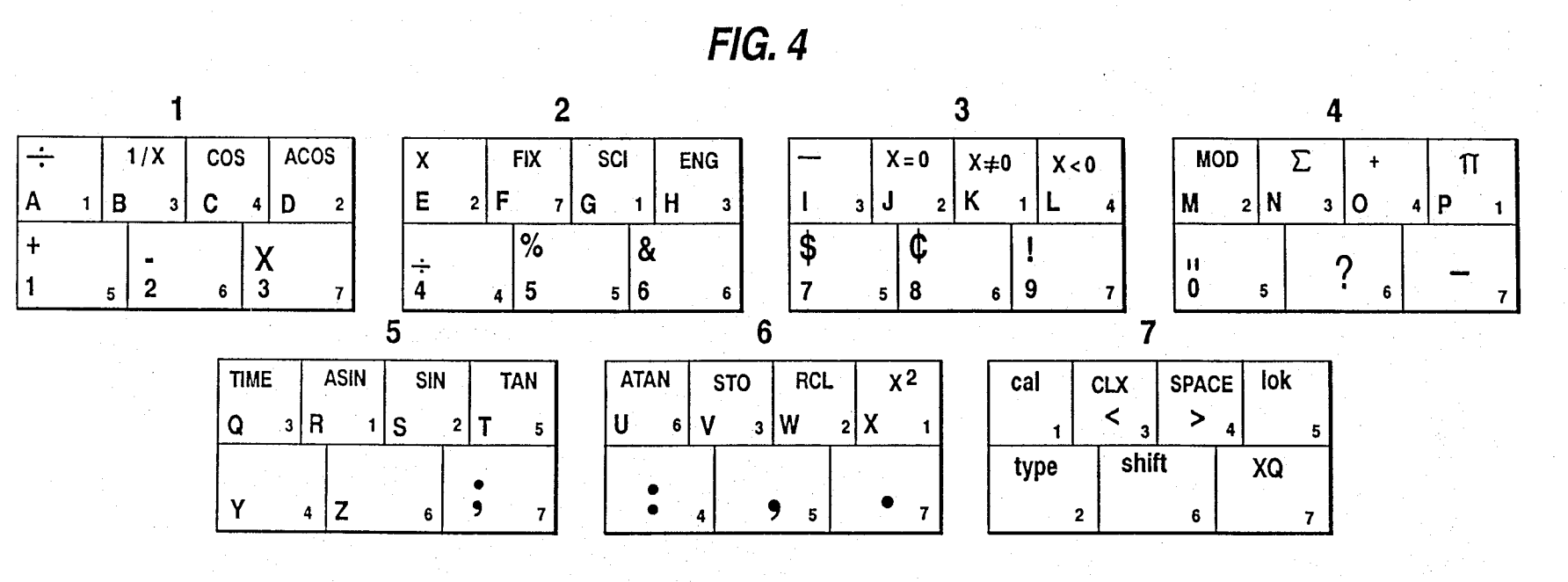
Figure 2:
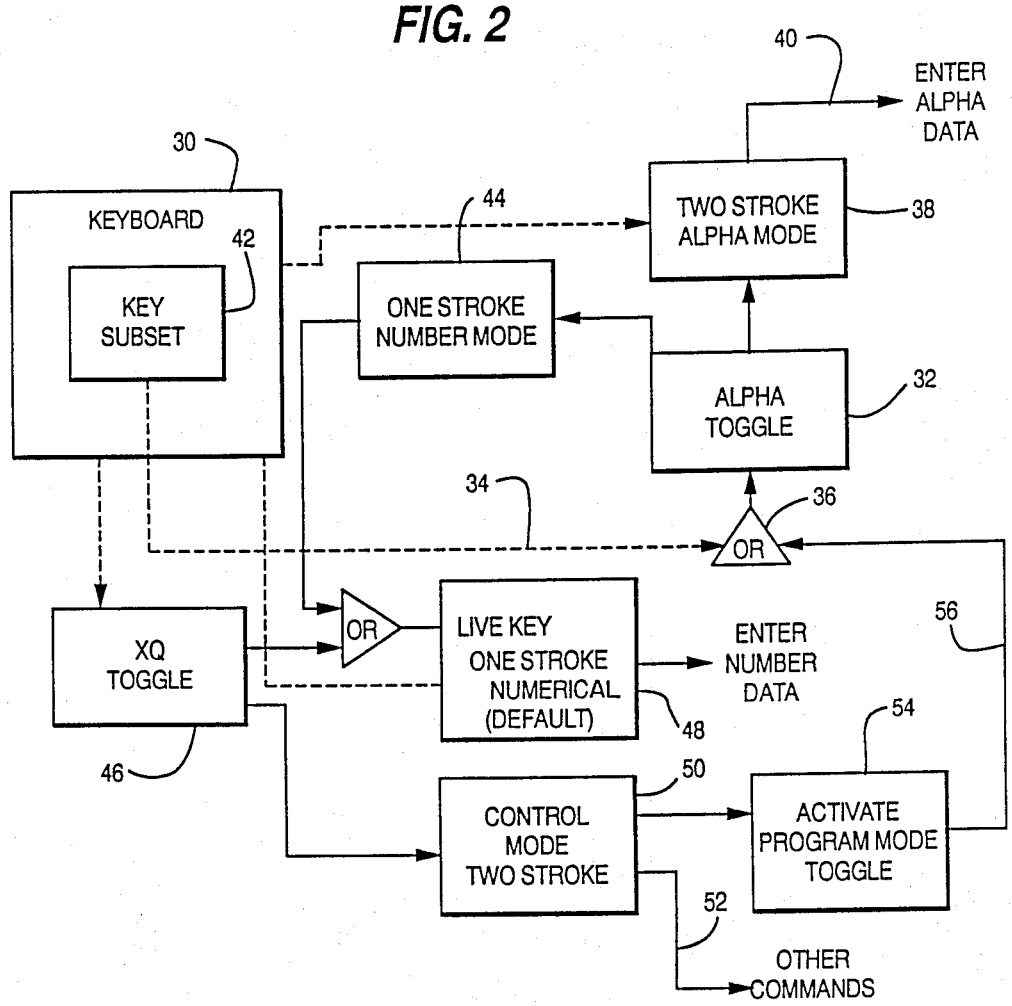
FIG. 2 is a block system diagram of control means afforded in a preferred embodiment of the invention.

In the generally similar keyboard arrays of FIGS. 1 and 4, sixteen keys are provided with spacings for ready manual access for touch typing, if desired. The keys operate in a primary default mode as a live keyboard for entry with single keystrokes. The indicia on the keys identify these entries as the ten decimal digits 0 through 9, some arithmetic operations for add, multiply, subtract and divide, a decimal key and an execute (XQ) control key for changing computer modes and entering computer commands. Other special purpose keys in addition to the four arithmetic keys may be provided, if desired. For example, the computer mode may be changed from one stroke per entry to two strokes per entry operation by the first stroke of the execute key.

In the data entry mode (either numeric or alpha) the successive characters of a multiple character word, such as a decimal number, are terminated and entered into an appropriate computer memory bank by the second stroke of the decimal point key 10 as indicated by the entry arrow notation. This mode of operation is described more fully in my U.S. Pat. Nos. 4,567,567, Jan. 28, 1986 and 4,680,725, July 14, 1987. The entered data words are then subject to the conventional computer operations such as arithmetic or data processing steps or sequences performed by stored program routines.

In the two stroke per entry mode the sixteen keys will provide at least 256 keystroke entry choices. Thus multiple choice indicia arrays are located in proximity to the keys to identify which key is to be chosen for a first stroke of a command identified by abbreviated or coded instructions. The second keystroke is identified by the key name legend alongside the coded command instruction. Appropriate computer program subroutines are selected by entry of the various commands. For example, the keystrokes to enter the program mode (in the lower right hand corner) are indicated by entry 14 labelled 3PRGM, operable after the XQ key is stroked once to enter the two stroke per entry mode. Thus the first stroke is designated by the proximity of the indicia grouping to the XQ key, and the second stroked is identified as the "3" key.

Now in accordance with this invention a complete set of alphabetic characters may be entered by a subset of as few as six keys in the two stroke per entry mode. Therefore the first XQ stroke commands the computer to execute a two stroke sequence. For the program mode the two stroke sequence is XQ-3. So, to put the computer in the program mode the keystrokes required are XQ-XQ3. Once in the Program mode, which is a TWO STROKE mode, only two strokes are required to perform most functions.

In the FIG. 1 embodiment, the subset of three keys 4, 5 and 6, are used in the alpha mode to find and select any of the alphabet characters, as indicated by the notation on the keyfaces. This advantageously saves search time for locating the alphabet from among sixteen keys and provides fast and accurate touch typing with three fingers having a home position from which the first stroke for each alphabetic character is selected without taking any time for moving fingers. The second sequential stroke as identified on the coded instructions, for this keyboard embodiment, are chosen for easy and quick fingerstroking from the home keys. Note, in this respect, that the most used character "e" is a double stroke of the "5" key not requiring any finger movement to reach a key for the second stroke.

The two sequential key strokes to enter the alpha mode (see lower right corner, 9) thus are made with the XQ key 12 and the decimal point/enter key 10. This mode extends the choices of keyboard entries from the sixteen keys beyond 256, by making the additional choices noted on the keyfaces available, including the alphabetic character choices on the 4, 5 and 6 keys. Thus, in the alpha mode, visual indicia means is provided for signifying the two keys to select and the sequence of stroking those keys by positioning the multiple choice menu in proximity to the key to be selected for the first stroke.

In this embodiment, a further subset of keys is selected and automatically activated after the first stroke for entry of the second stroke, namely the eleven keys comprising the nine decimal digit keys 1 to 9, the add key and the subtract key. Note also that is this alpha mode the decimal or period is selected by a 2-2 keystroke sequence, 24. By providing this alpha mode, thus 81 extra selections are available from the nine decimal digit keys 1 to 9 to provide substantially 337 selections from the respective two modes.

To retain the advantage of single stroke per entry or live keyboard mode for entry of decimal digits in the alpha mode, the decimal point key 10 serves as an alpha-decimal or single-double stroke toggle key, and is thus identified as a shift key. Similarly the decimal digit key "0" is used for the space key, which is frequently used in alpha entries.

To exit the alpha mode, the original alpha toggle selection sequence 9 is used. The program mode toggle, 14, is similarly actuated by a two stroke sequence, and it may include an automatic concurrent selection of the alpha mode.

The general system organization is shown in the block functional flow diagram of FIG. 2. The key actuation function flow lines from the keyboard 30 are shown in dotted line form. Pertinent control function interactions are shown in full line form.

It is clear that novel mode changing and two stroke per entry features are afforded by this invention thereby unexpectedly improving the state of the art by providing greater keyboard capacity with fewer keys, such as twelve or sixteen, for providing a large number of entry and command function choices, including all the alphabetic character selections usually performed on a full keyboard typewriter of over fifty keys. There has not been heretofore provided in this hand held computer art any recognition that alphameric operation could be affored by a two stroke per entry in the computer-keyboard interface to provide an alphbetic character entry mode using as few as six keys.

Now with reference to FIG. 2, the alphabetic mode toggle 32 is actuated by the alpha command initiated by the two stroke sequence of the XQ key 12 and the decimal point key 10, as explained. Thus, the key actuation flow line 34 leads from keyboard 30 to the "Or" circuit 36. The alpha toggle 32 thus selects the alpha mode 38 requiring two strokes for entry of each alpha character in response to keys in the subset 42, for the purpose of entering alpha data into the computer 40. The toggle is thereafter converted to the live keyboard one stroke per entry number mode 44 by a further actuation of alpha toggle 32 from the keyboard 30, such as by a single stroke of the decimal point key, which so operates in the alpha mode to provide a one stroke numeric digit entry for the next stroke. In the alpha mode then the alphabetic characters are successively entered with each two stroke selection forming a word that is ended with a single stroke of the "0" space key (18, FIG. 1) so operable in the alpha mode.

Note that line 34 is activated in the control mode which permits computer commands to be entered with two strokes per entry. This control mode is initiated by the XQ-keyboard instruction to the XQ toggle 46, which converts from the live key one stroke default mode 48 to the two stroke control mode 50. In the control mode the keyboard then can produce a large number of other commands 52, such as 256 from a sixteen key keyboard. One such command actuated the program mode toggle 54, which along line 56 also puts the alpha toggle into the alpha mode.

Although a preferred embodiment of sixteen keys has been discussed, it is possible to achieve complete entry of all twenty six alphabet characters along with ten extra entries such as the ten decimal digits with only six keys as illustrated in FIG. 3.

The keyboard configuration of FIG. 5 illustrates a twelve key keyboard array with all the alphabetic characters selected from the three keys 4, 5 and 6 for the initial keystroke. The nine keys 1 to 9 are activated after the initial stroke to receive the second stroke defining the particular character chosen from the menu on the respective keyface chosen for the first stroke. Other two stroke commands may be used for other functions not shown. It should be clear from the various embodiments that the accompanying indicia for showing a menu of selections in the alpha and other two-stroke modes of operation, provides by proximity location with respect to a particular key a first stroke choice for any of the functions coded on that menu. Thus whether the menu is on the keyface itself or constitutes other equivalent indicia alongside the key, for which the FIG. 1 embodiment is an example, the instructions identify two keys and the sequence of selection of those two keys for a desired choice on the menu.

A different sixteen key embodiment 20 is shown in the embodiment of FIG. 4. Therein, the alpha key choices are all located in the top row of keys 7, 8, 9 and divide, adjacent the computer activated temporary display panel 21. After having shifted to a two stroke mode by a single stroke of the XQ key, the alpha toggle is actuated by the two strokes 7-8, as indicated by the "alpha" menu listing in proximity to the "7" key. Since the alpha mode is a two stroke mode, if the computer is already in alpha, no stroke of the XQ key is required. Similarly a shift toggle for lower and upper case is selected from the menu adjacent the "8" key as the 8-9 two stoke sequence. The shift lock instruction is in the menu adjacent the 9 key.

The computer actuated temporary display panel 21 provides visual indicia when prepared and presented in the computer. Thus the current modes or operational status of the keyboard are displayed, as for example the "alpha" mode and the shift "SHF" mode. Thus, when in the alpha mode, further selections may be made to change the mode, or to provide a supplemental alpha mode as illustrated by the lower-upper case selections of the shift mode.

As explained before there also may be a "program" mode, which in the FIG. 1 embodiment has provided the alpha mode and at least 81 additional keyboard selections from the basic sixteen keys, when operating in the two stroke per selection mode. This is done by producing keyboard actuated mode changes when in the two stroke per entry mode that produces alternatives functions from the same subsets of keys, such as the alpha subset of keys.

It is clear that this invention has provided for all the modes and all the operational choices within the capacity of the computer and keyboard options clear instruction for using the keyboard from visual indicia presented in the vicinity of the keys as the computer is being operated, from a combination of menus and indicators including the keyface notation, the menus adjacent the keys, and the temporary computer generated indicia on the display panel. Thus every step of a sequence of keystrokes is indicated, so that reference to an accompanying operation manual is rarely necessitated.

In particular the instructions to enter the alpha mode and to make choices when operating in the alpha mode are briefly reviewed with reference to the FIG. 1 embodiment. From the basic computer command mode, the alpha mode for entry of alphabetic characters by two strokes per selected character is initiated by two mode selection keystrokes, namely XQ-Decimal.

Within that alpha mode, the first stroke is chosen from a menu positioned in proximity to the key to be stroked first. In this embodiment that menu is on the keyface itself, but in the FIG. 4 embodiment it is in a menu displayed adjacent to the key location. The positioning of the menu therefore is the indicia that identifies the first alpha keystroke. Also this positioning of the menu identifies the sequence of stroking of the two keys.

A secondary indicia therefore is provided to identify the second key to be stroked for a selection on the menu. In this embodiment that is the alpha character prefix legend. For example "B" on the "4" key menu is preceded by a "7" indicating that to be the second key to be stroked after the computer is preconditioned and prepared by entry of the first keystroke. Thus an auxiliary menu is implicitly provided here to identify the second key in the two keystroke sequence.

Other choices are possible in the alpha mode. Mode changes to the single stroke per entry mode are thus accomplished with the XQ-decimal key sequence. In that mode decimal digits 0 to 9 are entered with a single keystroke. Other single stroke function choices, indicated by the keyface indicia here, are the arithmetic functions plus, minus, multiply and divide. In this case the functional selections afforded by the alpha keys are changed so that the keys now operate as decimal digit keys, without leaving the alpha mode. Also as hereinbefore explained, a space may be entered with a single stroke from the "Zero" key.

To leave the alpha mode and return to the basic command mode, two strokes (XQ-Decimal) are required to actuate the alpha toggle key 9.

It is clear therefore that this invention has for the first time provided alphameric computer-keyboard systems with fewer keyboard keys and additionally has provided integral instructions functionally related to the key locations for operation of the computer in various modes and in particular for a two stroke per entry alphabetic character selection mode without necessitating reference to an operation manual. Accordingly those novel features of the invention descriptive of the nature and spirit of the invention are defined with particularity in the following claims.

I claim:

1. Apparatus for processing keyboard entered commands in a multi-purpose alphanumeric electronic computer, comprising in combination, a keyboard assembly with a keyboard array having a set of keys, control means in the computer for operating the keyboard in respective modes requiring respectively actuation of single keystrokes and actuation of two successive keystrokes for entry of a set of alphabetic characters into the computer, and visual indicia means positioned in a location integral with the keyboard assembly for identifying the first and second keys to be stroked and the stroking sequence for entry of the alphabetic characters in said set comprising a character identification code located in the proximity of the first key to be stroked in the sequence to identify that key, and a further visual indicia identification code for identifying the second key to be actuated in the stroking sequence.

2. The apparatus of claim 1 wherein said key set has no more than six keys for entering at least 26 alpha characters.

3. The apparatus of claim 1 further comprising, computer generated temporary display means for displaying visual indicia to indicate that the computer is in the alpha mode requiring said two successive keystrokes.

4. The apparatus defined in claim 1 further comprising a subset of ten keys in said set designated as numerical digit keys operable for entering numeric digits into the computer system from said set of ten keys with a single stroke per entry.

5. The apparatus defined in claim 1 further comprising, means for operating a subset of said set of keys in a two stroke per entry control mode of operation with the keys producing an additional set of computer operating instructions.

6. The apparatus of claim 1 wherein the two identification codes are located upon the keyface of at least a portion of said set of keys.

7. The apparatus of claim 1 wherein the two identification codes are located upon the face of said keyboard.

8. Apparatus for processing keyboard entered commands in a multi-purpose alphanumeric electronic computer, comprising in combination, an operating panel having both visual instructions and a keyboard assembly comprising a keyboard array having a set of keys, control means in the computer for operating the keyboard in respective modes requiring respectively actuation of single keystrokes and actuation of two successive keystrokes for entry of a set of alphabetic characters into the computer, and visual indicia means for displaying said visual instructions positioned in a location on the operating panel for identifying the first and second keys to be stroked and the stroking sequence for entry of the alphabetic characters in said set comprising a character identification code located in the proximity of the first key to be stroked in the sequence to identify that key, and a further visual indicia identification code for identifying the second key to be actuated in the stroking sequence.

9. Apparatus for processing keyboard entered commands in a multi-purpose alphanumeric electronic computer, comprising in combination, a keyboard assembly with a keyboard array having a set of keys, control means in the computer for operating the keyboard in respective modes requiring respectively actuation of single keystrokes from at least a portion of said set of keys and actuation of two successive keystrokes for entry of a set of alphabetic characters into the computer from at least a portion of said set of keys, and visual indicia means positioned in a location integral with the keyboard assembly for identifying the first and second keys to be stroked and the stroking sequence for entry of the alphabetic characters in said two successive keystroke mode comprising a character identification code located in the proximity of the first key to be stroked in the sequence to identify that key, and a further visual indicia identification code for identifying the second key to be actuated in the stroking sequence.

10. The apparatus of claim 9 wherein that one portion of said keys for entry of a set of alphabetic characters upon actuation of two successive keystrokes which is the first key to be stroked is located in an uppermost row of said set of keys.

11. The apparatus of claim 10 further comprising a display panel containing computer generated temporary display indicia means and said keyboard assembly, wherein said uppermost row of keys is located adjacent said temporary display indicia means.

12. The apparatus of claim 9 further comprising temporary display indicia means on a display panel containing said keyboard array and means for indicating on said temporary display indicia means when the keyboard is operated in the mode for entry of alphabetic characters.

* * * * *